(12) United States Patent
Maida et al.

(10) Patent No.: US 9,278,881 B2
(45) Date of Patent: Mar. 8, 2016

(54) EUV LITHOGRAPHY MEMBER, MAKING METHOD, AND TITANIA-DOPED QUARTZ GLASS

(71) Applicant: SHIN-ETSU CHEMICAL CO., LTD., Tokyo (JP)

(72) Inventors: Shigeru Maida, Joetsu (JP); Hisatoshi Otsuka, Joetsu (JP); Tetsuji Ueda, Sasebo (JP); Masanobu Ezaki, Koriyama (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/146,182

(22) Filed: Jan. 2, 2014

(65) Prior Publication Data
US 2014/0206524 A1    Jul. 24, 2014

(30) Foreign Application Priority Data

Jan. 22, 2013   (JP) ................. 2013-008909

(51) Int. Cl.
| | |
|---|---|
| *C03C 3/06* | (2006.01) |
| *C03C 10/00* | (2006.01) |
| *C03C 4/00* | (2006.01) |
| *C03B 19/14* | (2006.01) |
| *C03B 20/00* | (2006.01) |
| *C03B 25/02* | (2006.01) |
| *G03F 7/20* | (2006.01) |

(Continued)

(52) U.S. Cl.
CPC .............. *C03C 10/00* (2013.01); *C03B 19/1453* (2013.01); *C03B 19/1469* (2013.01); *C03B 20/00* (2013.01); *C03B 25/02* (2013.01); *C03C 3/06* (2013.01); *C03C 4/0085* (2013.01); *G03F 1/60* (2013.01); *G03F 7/70958* (2013.01); *C03B 2201/42* (2013.01); *C03B 2207/20* (2013.01); *C03C 2201/42* (2013.01); *G03F 1/22* (2013.01)

(58) Field of Classification Search
CPC ............ C03C 2201/06; C03C 2201/40; C03C 2201/42; C03C 3/06
USPC .......................................................... 501/54
See application file for complete search history.

(56) References Cited

U.S. PATENT DOCUMENTS

| | | | |
|---|---|---|---|
| 6,776,006 | B2 | 8/2004 | Best et al. |
| 7,462,574 | B2 | 12/2008 | Iwahashi et al. |
| 8,012,653 | B2 | 9/2011 | Koike et al. |

(Continued)

FOREIGN PATENT DOCUMENTS

| | | |
|---|---|---|
| EP | 1608599 A | 10/2004 |
| EP | 2 145 865 A1 | 1/2010 |

(Continued)

OTHER PUBLICATIONS

Extended European Search Report dated Mar. 25, 2014, issued in corresponding European application No. 14152115.3 (6 pages).

(Continued)

*Primary Examiner* — Noah Wiese

(74) *Attorney, Agent, or Firm* — Westerman, Hattori, Daniels & Adrian, LLP

(57) ABSTRACT

A member is made of titania-doped quartz glass in which striae have a curvature radius of at least 150 mm in a surface perpendicular to an EUV-reflecting surface. The member free of exposed striae and having a high flatness is useful in EUV lithography.

8 Claims, 3 Drawing Sheets

(51) Int. Cl.
  *G03F 1/60* (2012.01)
  *G03F 1/22* (2012.01)

(56) References Cited

U.S. PATENT DOCUMENTS

| | | | |
|---|---|---|---|
| 8,105,734 | B2 | 1/2012 | Maida et al. |
| 8,356,494 | B2* | 1/2013 | Mitsumori et al. ............. 65/413 |
| 2006/0137397 | A1* | 6/2006 | Bookbinder et al. ........... 65/17.3 |
| 2006/0137398 | A1* | 6/2006 | Bleaking et al. ............... 65/17.3 |
| 2008/0274869 | A1* | 11/2008 | Englisch et al. ................ 501/54 |
| 2010/0179047 | A1* | 7/2010 | Koike et al. ..................... 501/54 |
| 2010/0323871 | A1* | 12/2010 | Koike et al. ..................... 501/53 |
| 2011/0301015 | A1* | 12/2011 | Mitsumori et al. .............. 501/53 |
| 2012/0058419 | A1* | 3/2012 | Maida et al. ....................... 430/5 |
| 2012/0289393 | A1* | 11/2012 | Kushibiki et al. ............... 501/53 |

FOREIGN PATENT DOCUMENTS

| | | |
|---|---|---|
| JP | 08-031723 A | 2/1996 |
| JP | 2004-315351 A | 11/2004 |
| JP | 2006-240979 A | 9/2006 |
| JP | 2010-013335 A | 1/2010 |
| JP | 2010-135732 A | 6/2010 |
| WO | 02/32622 A1 | 4/2002 |

OTHER PUBLICATIONS

Agarwal, Anand et al., "A simple IR spectroscopic method for determining fictive temperature of silica glasses", Journal of Non-Crystalline Solids, 1995, No. 185, pp. 191-198.

* cited by examiner

MEASUREMENT POSITIONS
(9 POSITIONS)

EUV LITHOGRAPHY MEMBER, MAKING METHOD, AND TITANIA-DOPED QUARTZ GLASS

CROSS-REFERENCE TO RELATED APPLICATION

This non-provisional application claims priority under 35 U.S.C. §119(a) on Patent Application No. 2013-008909 filed in Japan on Jan. 22, 2013, the entire contents of which are hereby incorporated by reference.

TECHNICAL FIELD

This invention relates to an EUV lithography member, a method for manufacturing the same, and titania-doped quartz glass for EUV lithography.

BACKGROUND ART

In the advanced lithography process for the fabrication of semiconductor devices, a light source of shorter wavelength is used for exposure. A subsequent transition to lithography using extreme ultraviolet (EUV) is regarded promising.

In the EUV lithography using EUV light with a short wavelength of 13.5 nm, a reflecting optical system is employed because no materials having a high transmittance at such short wavelength are available. Reflection of EUV light is undertaken by a Si/Mo multilayer coating sputtered on a low thermal expansion material substrate.

One of the most serious problems which must be overcome before EUV lithography can be implemented in practice is the manufacture of defect-free photomasks. Although defects like irregularities on the surface of photomask substrate are permissible in the conventional KrF lithography (wavelength 248.3 nm) and ArF lithography (wavelength 193.4 nm) relying on the refractive optical system, defects of the same order are not negligible in the EUV lithography because of the short wavelength and the reflecting optical system used therein.

Further, EUV lithography members, especially photomask substrates are required to be fully flat. At the practical level, photomask substrates must have a very high flatness of up to 30 nm within a central region of 142 mm×142 mm squares.

Low thermal expansion materials known useful as EUV lithography members include titania-doped quartz glass. However, it is difficult to manufacture substrates having a high flatness from titania-doped quartz glass when the glass has a non-uniform titania concentration. When a glass substrate having a non-uniform titania concentration is polished, the substrate surface becomes irregular due to varying reactivity with the polishing slurry and differential grinding speed. In this regard, Patent Document 1, for example, discloses that titania-doped quartz glass having a narrow titania concentration distribution is useful as EUV lithography members.

Patent Document 2 refers to the refractive index distribution of titania-doped quartz glass that is determined by taking into account the polishing mechanism so that high-flatness substrates may be readily manufactured therefrom.

During manufacture of titania-doped quartz glass, zones having a non-uniform titania concentration, known as striae, may be formed perpendicular to the growth direction of titania-doped quartz glass, due to temperature variations at the growth face, variations of the reactant gas composition, and other factors. Striae are generally variations of titania concentration at intervals of several microns to several millimeters, and structurally strained sites are present within the stria.

Since strained sites within titania-doped quartz glass are structurally unstable, selective abrasion occurs thereat during polishing, leading to aggravated flatness. Based on the discovery that striae-strained sites are converted into numerical values of stress, Patent Document 3 discloses the stress level permissible as EUV lithography members and the method of reducing the stress.

Patent Document 4 discloses that a plate member in which striae planes are parallel to the plate surface is used to prevent striae from being exposed and minimize the impact thereof.

Patent Document 5 discloses a method of removing striae from titania-doped quartz glass by using a zone melting method to apply shear stresses to the glass.

CITATION LIST

Patent Document 1: JP-A 2004-315351 (U.S. Pat. No. 7,462,574, EP 1608599)
Patent Document 2: JP-A 2010-013335 (U.S. Pat. No. 8,105,734, EP 2145865)
Patent Document 3: JP-A 2010-135732 (U.S. Pat. No. 8,012,653)
Patent Document 4: WO 02/032622
Patent Document 5: JP-A 2006-240979

SUMMARY OF INVENTION

None of the prior art techniques have succeeded in complete removal of striae from titania-doped quartz glass. Patent Document 4 describes nowhere how to prepare a plate member in which striae planes are parallel to the plate surface. There still exists a need for titania-doped quartz glass which excludes the impact of striae and is useful as EUV optical members.

An object of the invention is to provide an EUV lithography member on which no striae are exposed, a method for preparing the member, and titania-doped quartz glass suited for the manufacture of the member.

The inventors have discovered titania-doped quartz glass which is useful as EUV lithography members.

In one aspect, the invention provides an EUV lithography member having a surface where EUV light is reflected, made of titania-doped quartz glass containing striae having a curvature radius of at least 150 mm in a surface perpendicular to the EUV-reflecting surface.

In a preferred embodiment, the member is directly formed from titania-doped quartz glass which has been homogenization treated by a zone melting method, without hot shaping.

Most often, the member is an EUV lithography photomask substrate.

In another aspect, the invention provides a method for preparing an EUV lithography member, comprising the steps of homogenization treating titania-doped quartz glass by a zone melting method, and forming it into the member without hot shaping.

Preferably, the titania-doped quartz glass after homogenization treatment has a diameter of at least 220 mm.

In a further aspect, the invention provides a titania-doped quartz glass for EUV lithography, containing striae having a curvature radius of at least 150 mm in a surface perpendicular to an EUV light-reflecting surface.

In a preferred embodiment, the titania-doped quartz glass has a fictive temperature of equal to or lower than 850° C. and/or a fictive temperature distribution of equal to or less than 20° C.

Advantageous Effects of Invention

An EUV lithography member of titania-doped quartz glass having a high flatness is available. No striae are exposed on the member.

DESCRIPTION OF EMBODIMENTS

Figure 1:
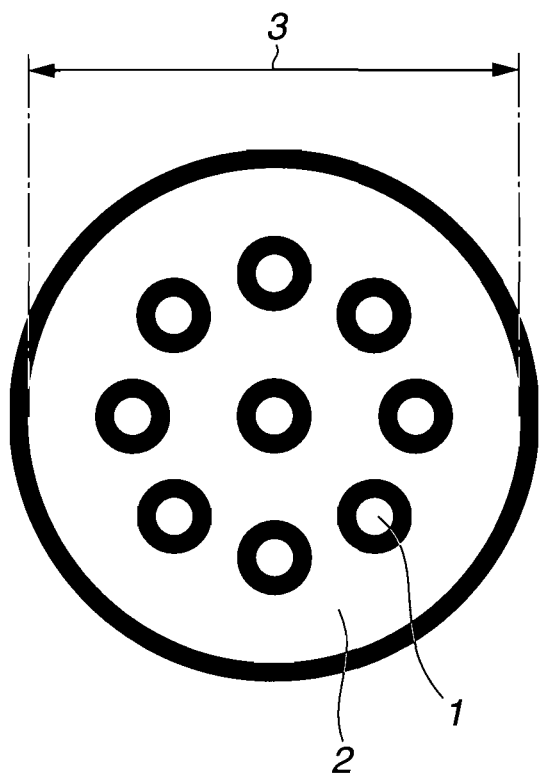
FIG. 1 is a transverse cross-sectional view of a burner used in homogenization treatment by a zone melting method.

The invention is directed to titania-doped quartz glass having a surface where EUV light is reflected. The titania-doped quartz glass contains striae having a curvature radius of at least 150 mm, preferably at least 200 mm, and more preferably at least 250 mm in a surface perpendicular to the EUV-reflecting surface. The striae have a large curvature radius in the perpendicular surface to the EUV-reflecting surface and extend parallel to or substantially parallel to the EUV-reflecting surface, indicating that few or no striae are exposed on the EUV-reflecting surface. Since striae are flat and have a large curvature radius, formation of asperity on the EUV-reflecting surface by striae is consequently minimized. An EUV optical member having an improved flatness is available. Even when striae are exposed on the EUV-reflecting surface, degradation of flatness is minimized because the striae have a large curvature radius in the perpendicular surface to the EUV-reflecting surface and extend parallel to or substantially parallel to the EUV-reflecting surface so that the striae may be exposed on the EUV-reflecting surface at an angle approximate to parallel.

Even when striae with a large curvature radius are exposed on the EUV-reflecting surface at an angle approximate to parallel whereby flatness is degraded, flatness may be readily improved by selectively grinding those regions of degraded flatness. On the other hand, when striae with a small curvature radius are exposed on the EUV-reflecting surface, recovery of flatness is difficult because many striae are exposed in a narrow region of the EUV-reflecting surface.

The titania-doped quartz glass manufactured by the invention can be processed to a flatness of 100 nm or less in a central region of 132×132 mm squares for photomask substrate by polishing on a double-side polishing machine. Flatness may be further improved by using a technique of selectively polishing raised portions on the substrate surface, known as "partial polishing technique".

As used herein, the "striae" in titania-doped quartz glass refer to microscopic variations in titania-doped quartz glass composition like variations of $TiO_2$ concentration and variations of OH concentration, and can be detected as a change of refractive index.

A refractive index from which the curvature radius of striae is computed may be measured by using a Fizeau interferometer (ZYGO MARK IV) equipped with a He—Ne laser light source of wavelength 632.8 nm, in the oil-on-plate mode. Specifically, an oil having an equivalent refractive index to quartz glass is filled between two parallel plates of quartz glass having a low refractive index distribution, and the refractive index distribution of parallel plates is previously measured. Then a titania-doped quartz glass member having polished opposite surfaces is sandwiched between the two parallel plates, the oil is filled between the parallel plates and the member, and the refractive index distribution of the titania-doped quartz glass member sandwich is measured. By subtracting the refractive index distribution of parallel plates from the refractive index distribution of the titania-doped quartz glass member sandwich, the refractive index distribution of the titania-doped quartz glass member is determined. On measurement of refractive index distribution, the refractive index distribution of a minute region can be measured by using a 25-mm aperture converter for magnification, whereby the curvature radius of local striae can be investigated. While a refractive index distribution is measured over the entire area in one surface perpendicular to the EUV-reflecting surface, the minimum of curvature radii is assigned as the curvature radius of striae in the perpendicular surface to the EUV-reflecting surface. Also preferably, the curvature radius of striae is at least 150 mm, more preferably at least 200 mm, and even more preferably at least 250 mm even in a surface orthogonal to one perpendicular surface to the EUV-reflecting surface. The sample used to measure the curvature radius of striae is a titania-doped quartz glass plate of 0.7 mm thick having both surfaces polished.

Another embodiment of the invention is a method for preparing an EUV lithography member of titania-doped quartz glass containing striae having a curvature radius of at least 150 mm in a surface perpendicular to the EUV-reflecting surface. The method comprises the steps of subjecting titania-doped quartz glass to homogenization treatment by a zone melting method, and forming it into the member without hot shaping. The homogenization treatment by zone melting method allows striae in titania-doped quartz glass to be aligned parallel, which minimizes the exposure of striae on the EUV-reflecting surface when the titania-doped quartz glass is processed into an EUV lithography member. Striae in titania-doped quartz glass depend on the geometry of the growth face of a titania-doped quartz glass ingot during its manufacture. Independent of a particular method of ingot manufacture, the geometry of the growth face of a titania-doped quartz glass ingot has a certain curvature. Therefore, if homogenization treatment by zone melting method is omitted, it is unlikely that striae have a curvature radius of at least 150 mm.

In the present invention, the hot forming is a step as follows: in a vacuum melting furnace, a die formed of a high-purity carbon material or the like is charged with the ingot, and assembly is held in a furnace atmosphere of an inert gas such as argon, at a pressure slightly reduced from the atmospheric pressure and in a temperature range of 1700 to 1900° C. for 30 to 120 minutes.

Hot shaping serves to reduce the curvature radius of striae in an outer peripheral portion of titania-doped quartz glass.

This leads to a likelihood that striae are exposed on the EUV-reflecting surface. In this sense, it is desired that an EUV lithography member be prepared without hot shaping.

To prepare an EUV lithography member without hot shaping, the shape of a titania-doped quartz glass ingot after homogenization by zone melting must be enlarged. For example, where it is desired to have a photomask substrate, a titania-doped quartz glass ingot must have a diameter of at least 220 mm. To this end, the zone melting method preferably uses at least two, more preferably at least three heating burners. With a single heating burner, heating is insufficient so that homogenization of a large diameter titania-doped quartz glass ingot by the zone melting method may be retarded, and the melting zone width is expanded so that enlargement of the curvature radius of striae in titania-doped quartz glass may also be retarded.

The combustible gas used for the homogenization by zone melting is preferably hydrogen. Use of hydrogen allows for local heating, enables to restrict the melting zone, and facilitates to enlarge the curvature radius of striae in titania-doped quartz glass. FIG. 1 shows one exemplary burner used for homogenization by zone melting. The burner having an inner diameter 3 includes circumferentially arranged nozzles 1 for injecting combustion-supporting gas and a remaining space 2 for injecting combustible gas. The burner inner diameter 3 (i.e., the diameter of the combustible gas-injecting port) is preferably up to 60 mm, more preferably up to 50 mm, and even more preferably up to 40 mm. Also preferably the burner inner diameter 3 is at least 20 mm. If the inner diameter is less than 20 mm, it may be difficult to maintain the melting zone. If the inner diameter exceeds 60 mm, it may be difficult to narrow the melting zone and hence, to enlarge the curvature radius of striae.

Preferably, the titania-doped quartz glass has a fictive temperature distribution of less than or equal to 20° C., more preferably less than or equal to 10° C., and even more preferably less than or equal to 5° C. If the fictive temperature distribution is broader, there may be a distribution of thermal expansion properties within titania-doped quartz glass, which may be unsuitable for use as EUV lithography members.

Further preferably, the titania-doped quartz glass has a fictive temperature of lower than or equal to 850° C., more preferably lower than or equal to 800° C., even more preferably lower than or equal to 775° C., and most preferably lower than or equal to 760° C. Since the temperature range where the glass exhibits low thermal expansion becomes broader as the fictive temperature lowers, the titania-doped quartz glass having a lower fictive temperature is suitable as optical members in a EUV lithography exposure tool for mass-scale manufacture which are expected to encounter higher temperatures. The fictive temperature of the titania-doped quartz glass is typically at least 500° C. though the lower limit is not critical. It is noted that the fictive temperature of titania-doped quartz glass may be measured by the method described in J. Non-Cryst. Solids, 185, 191 (1995).

The fictive temperature of titania-doped quartz glass may be reduced by annealing treatment. The preferred annealing treatment includes holding in air at a temperature of 700 to 1,300° C. for 1 to 200 hours and slow cooling down to 300° C., preferably down to 200° C. An appropriate slow cooling rate is in the range of 1 to 20° C./hr, more preferably 1 to 10° C./hr. In particular, a fictive temperature below 760° C. is obtainable by setting the slow cooling rate below 1° C./hr in the temperature range from 850° C. to 700° C.

When titania-doped quartz glass is subjected to annealing-slow cooling treatment in order to control the fictive temperature distribution, the thickness of the glass is preferably up to 10 cm, more preferably up to 5 cm, and even more preferably up to 1 cm.

Now it is described how to prepare titania-doped quartz glass for EUV lithography and an EUV lithography member according to the invention. A titania-doped quartz glass ingot may be manufactured by providing a quartz glass manufacturing furnace having a burner, feeding a hydrogen-containing combustible gas and an oxygen-containing combustion-supporting gas to the burner, burning the gases to form an oxyhydrogen flame at the burner tip, feeding a silicon-providing reactant gas and a titanium-providing reactant gas into the flame, for thereby subjecting the reactant gases to hydrolysis to form fine particles of silicon oxide, titanium oxide, and complex thereof, depositing the fine particles on a target disposed in front of the burner tip, and letting titania-doped quartz glass grow on the target. The ingot may be manufactured by the direct method, for example.

The silicon-providing reactant gas used herein may be selected from well-known organosilicon compounds, for example, silicon tetrachloride, chlorosilanes such as dimethyldichlorosilane and methyltrichlorosilane, and alkoxysilanes such as tetramethoxysilane, tetraethoxysilane, and methyltrimethoxysilane.

The titanium-providing reactant gas used herein may also be selected from well-known compounds, for example, titanium halides such as titanium tetrachloride and titanium tetrabromide, and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

It is preferred that the titania-doped quartz glass have a titania content of 2 to 11% by weight, especially 5 to 8.5% by weight.

The combustible gas used herein is typically hydrogen or hydrogen-containing gas, optionally in combination with carbon monoxide, methane, propane or the like. The combustion-supporting gas is typically oxygen or oxygen-containing gas.

Figure 2:
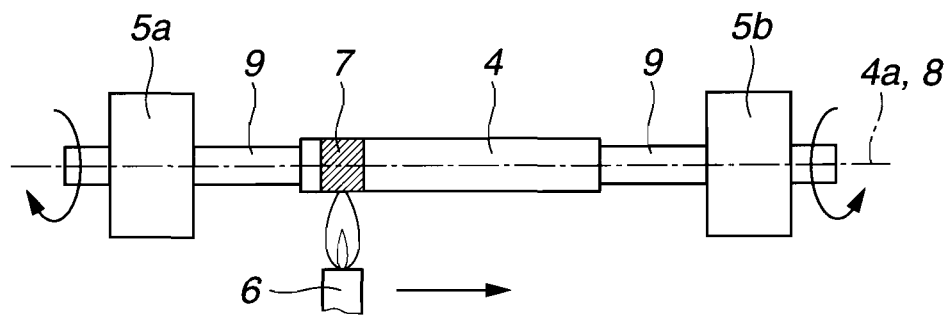
FIG. 2 is a schematic view illustrating homogenization treatment by a zone melting method.

The titania-doped quartz glass ingot thus manufactured is subjected to homogenization treatment by the zone melting method. FIG. 2 schematically illustrates, in principle, the homogenization treatment by the zone melting method. The titania-doped quartz glass ingot 4 having an axis 4a of growth is held at opposite ends by a pair of rotatable holder means, typically lathe chucks 5a, 5b. A burner 6 is ignited to intensely heat a part of the ingot 4 to create a molten zone 7. Thereafter the burner 6 is axially moved while the ingot 4 is twisted by differential rotation of left and right chucks 5a and 5b. Then shear stresses are generated in the molten zone 7 in a direction perpendicular to the moving direction of the burner 6, for homogenization treatment of agitating the molten zone to remove striae and to uniform the titania concentration. In FIG. 2, an axis 8 of homogenization treatment is substantially aligned with the axis 4a of ingot growth. In the homogenization treatment by zone melting, preferably a plurality of burners are used. Where a plurality of burners are used, they are preferably arranged symmetrically with respect to the homogenization treatment axis 8. Where three burners are used, for example, they are arranged at an angle of 120° about the homogenization treatment axis 8. Also, where a plurality of burners are used, they are arranged on an identical circle about the homogenization treatment axis in order to create a narrow molten zone.

For the homogenization treatment by zone melting, the combustible gas used is typically hydrogen or hydrogen-containing gas, optionally in combination with carbon monoxide, methane, propane or the like. The combustion-supporting gas is typically oxygen or oxygen-containing gas.

When the titania-doped quartz glass ingot 4 is held at opposite ends by a pair of lathe chucks 5a, 5b, support bars 9 preferably intervene between the ingot 4 and the chucks 5a, 5b, as shown in FIG. 2. The support bars 9 are made of glass having a coefficient of linear expansion of $0 \times 10^7/°$ C. to $6 \times 10^7/°$ C. in the temperature range of 0° C. to 900° C. Titania-doped quartz glass is most preferred as the support bars.

Means for providing differential rotation between left and right chucks 5a and 5b is, for example, by counter rotating the chucks 5a and 5b. The homogenization treatment may be performed once or two or more times. Repeating homogenization treatment two or more times is more effective for striae removal and improving compositional uniformity or homogeneity. Although homogenization treatment may be repeated any desired times, repetition is preferably limited to 10 or less times from the economic aspect.

Once the titania-doped quartz glass ingot is subjected to homogenization treatment by zone melting, it is machined or otherwise processed to form an EUV lithography member without hot shaping. If titania-doped quartz glass is hot shaped, the curvature radius of striae in an outer peripheral portion of the quartz glass is reduced. To dispense with hot shaping, the titania-doped quartz glass ingot after the homogenization treatment should preferably have a diameter of at least 220 mm. Since microscopic bubbles can be introduced into an outer peripheral portion of the titania-doped quartz glass ingot during the homogenization treatment by zone melting, more preferably the quartz glass ingot after the homogenization treatment should have a diameter of at least 250 mm. The titania-doped quartz glass ingot after the homogenization treatment should preferably have a diameter of up to 600 mm although the upper limit is not critical.

The titania-doped quartz glass ingot after the homogenization treatment by zone melting is machined to the predetermined size by grinding or slicing. This is followed by lapping on a double-side lapping machine with abrasives such as silicon oxide, aluminum oxide, molybdenum oxide, silicon carbide, diamond, cerium oxide, or colloidal silica, and grinding or the like, until an EUV lithography member is completed.

After the homogenization treatment by zone melting, the titania-doped quartz glass ingot is preferably subjected to annealing-slow cooling treatment for the purposes of reducing the fictive temperature and its distribution. As long as the homogenization treatment by zone melting has been finished, the annealing-slow cooling treatment may be carried out on the quartz glass at any point during the step of machining into an EUV lithography member. When subjected to annealing-slow cooling treatment for the purpose of restraining the fictive temperature distribution, the titania-doped quartz glass should preferably have a reduced thickness.

EXAMPLE

Examples and Comparative Examples are given below for illustrating the invention although the invention is not limited thereto.

Example 1

Ingot Manufacture

Figure 3A:
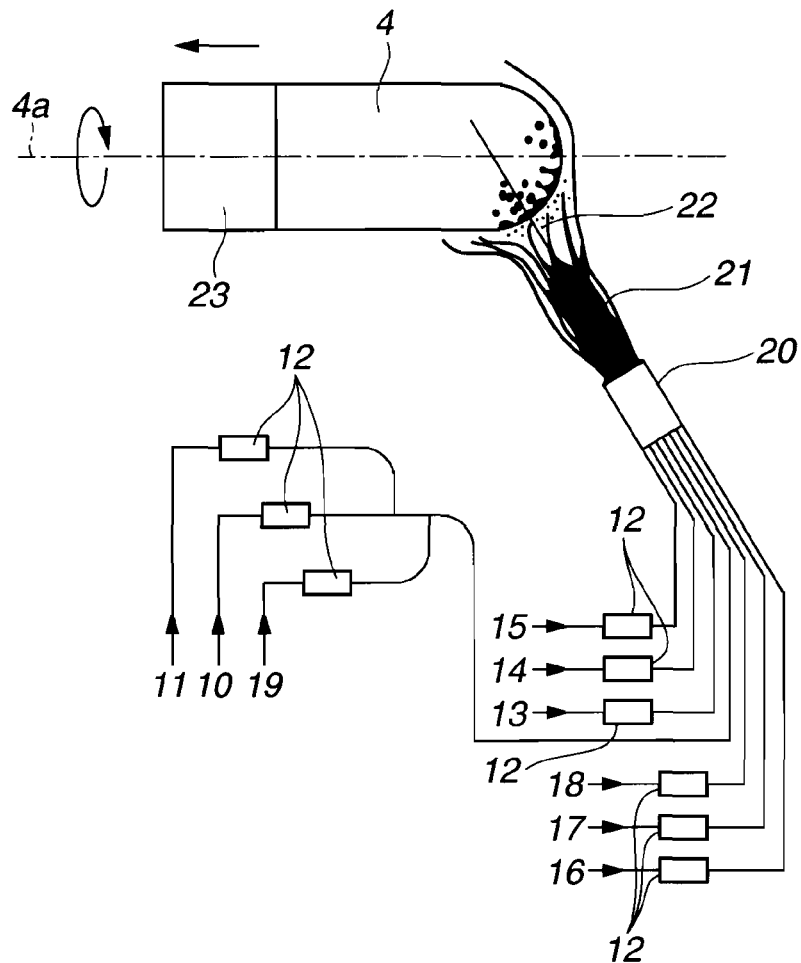
FIG. 3 illustrates a system for manufacturing a titania-doped quartz glass ingot, FIG. 3a being a schematic view and FIG. 3b being a transverse section of the oxyhydrogen flame burner used therein.
Figure 3B:
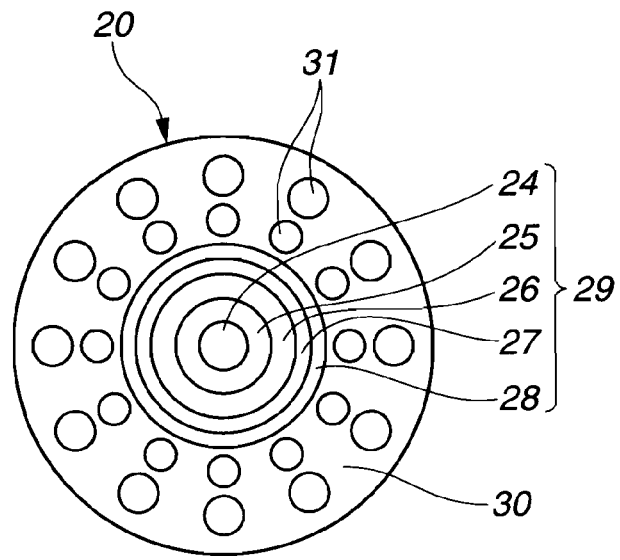

A titania-doped quartz glass ingot was manufactured by the direct method using a burner as shown in FIG. 3 and described in JP-A H08-031723. In FIG. 3a, the system includes a $SiCl_4$ feed tube 10, a $TiCl_4$ feed tube 11, flow meters 12, hydrogen gas feed tubes 13, 14, 15, oxygen gas feed tubes 16, 17, 18, 19, a main burner 20 of quartz for producing an oxyhydrogen flame 21, a target or support 23 on which titania-doped silica fine particles 22 are deposited, and an ingot 4. The main burner 20 is illustrated in the transverse cross-sectional view of FIG. 3b as comprising a five-fold tube 29 consisting of nozzles 24 to 28, an outer shell 30 enclosing the five-fold tube 29, and nozzles 31 disposed inside the outer shell 30. The central or first nozzle 24 receives $SiCl_4$ and $TiCl_4$ from the feed tubes 10 and 11 and oxygen gas from the feed tube 19. If necessary, an inert gas such as argon gas may be fed together. The second and fourth nozzles 25 and 27 receive oxygen gas from the feed tubes 16 and 17, and the third and fifth nozzles 26 and 28 receive hydrogen gas from the feed tubes 13 and 14. The outer shell 30 receives hydrogen gas from the feed tube 15, and the nozzles 31 receive oxygen gas from the feed tube 18.

A titania-doped quartz glass ingot was manufactured by feeding the gases shown in Table 1 to respective nozzles of the main burner, effecting hydrolysis of silicon tetrachloride and titanium tetrachloride in oxyhydrogen flame to produce particles of $SiO_2$ and $TiO_2$, and depositing the particles on the target which is disposed forward of the quartz burner. The target was retracted at a speed of 10 mm/hr while rotating at 50 rpm. The quartz glass ingot had a diameter of 140 mm and a length of 650 mm.

TABLE 1

| Main burner (Symbol in FIG. 3(b)) | Feed Gas | Gas flow rate |
| --- | --- | --- |
| 24 | $SiCl_4$ | 1,250 g/hr |
|  | $TiCl_4$ | 150 g/hr |
|  | $O_2$ | 2 $Nm^3$/hr |
| 25 | $O_2$ | 1 $Nm^3$/hr |
| 26 | $H_2$ | 15 $Nm^3$/hr |
| 27 | $O_2$ | 8 $Nm^3$/hr |
| 28 | $H_2$ | 10 $Nm^3$/hr |
| 31 | $O_2$ | 10 $Nm^3$/hr |
| 30 | $H_2$ | 20 $Nm^3$/hr |

[Homogenization Treatment by Zone Melting Method]

The titania-doped quartz glass ingot was welded to support bars of (similarly manufactured) titania-doped quartz glass and fixedly secured by lathe chucks via the support bars (see FIG. 2).

First Homogenization by Zone Melting

While the lathe chucks were synchronously rotated at 20 rpm, an end portion of the quartz glass ingot near the left support bar was intensely heated by an oxyhydrogen burner assembly. Specifically, three burners having a hydrogen gas injection orifice with an inner diameter of 40 mm were arranged about the homogenization axis 8 at an angle of 120° and in a common radial plane. After it was confirmed that the portion of the quartz glass ingot was melted, the rotation of the right chuck was accelerated to 40 rpm to produce a differential in rpm between the chucks for thereby moderately twisting the quartz glass ingot; the distance between the chucks was expanded for thinning the quartz glass ingot; the burner assembly was moved rightward at a speed of 10 mm/min. In this way, the titania-doped quartz glass ingot was shaped into a cylinder having a diameter of 80 mm. After shaping into a cylinder having a diameter of 80 mm, the chucks were co-rotated synchronously at 50 rpm; and the burner assembly was moved back to the left end of the quartz glass ingot. A molten zone was formed by intense heating, after which the rotational direction of the right chuck was reversed from that of the left chuck, that is, the right chuck was counter-rotated at 60 rpm to cause agitation in the molten zone. At the same time, the burner assembly was moved rightward at a speed of 10 mm/min for homogenization of the quartz glass ingot. The same operation was repeated in the same direction, completing two homogenization treatments in total.

Second Homogenization by Zone Melting

Next, the chucks were co-rotated synchronously at 50 rpm; and the burner assembly was moved back to the left end of the quartz glass ingot. A molten zone was formed by intense heating. After confirmation of melting, with the left chuck secured, the right chuck was slowly moved toward the left chuck to reduce the distance between the chucks for thereby shaping into a spherical body having a diameter of 180 mm.

The spherically shaped titania-doped quartz glass body was cut off at opposite ends from the support bars. The quartz glass body was rested on a platform with one cut face at the bottom, and support bars were welded again to the quartz glass body at horizontally opposed sides. As a result, the homogenization axis was changed at right angles.

Homogenization treatment was carried out by the same operation as the first homogenization treatment by zone melting.

Further, the chucks were co-rotated synchronously at 50 rpm; and the burner assembly was moved back to the left end of the quartz glass ingot. A molten zone was formed by intense heating. After confirmation of melting, the right chuck was slowly moved toward the left chuck to reduce the distance therebetween, and the burner assembly was moved rightward for thereby shaping the quartz glass body into a tablet having a straight barrel with a diameter of 250 mm. The tablet shaped titania-doped quartz glass body was cut off at opposite ends from the support bars.

[Member Preparation Step 1]

The opposite ends of the straight barrel of the tablet shaped titania-doped quartz glass body were cut perpendicular to the homogenization treatment axis during the second homogenization treatment by zone melting, obtaining a cylindrical titania-doped quartz glass body having a diameter of 250 mm and a length of 150 mm. The side surface of the cylindrical body was cut off to form a rectangular block of 155×155×150 mm. The block was sliced into a substrate of 6.8 mm thick, which was lapped.

[Annealing Step]

The titania-doped quartz glass substrate was placed in a furnace made of high purity porous silicon carbide insulating material, heated in air at 850° C. for 150 hours, and slowly cooled at a rate of 0.75° C./hr down to 700° C. and at a rate of 2° C./hr down to 200° C.

[Member Preparation Step 2]

The titania-doped quartz glass substrate as annealed was polished on end faces. On the main surfaces, rough polishing was performed with ceria abrasive, and precision polishing performed using a soft suede as polishing pad and a colloidal silica water dispersion having a $SiO_2$ concentration of 40 wt % as polishing slurry. The polishing step was followed by washing and drying, yielding a polished substrate of 152.4× 152.4×6.35 mm.

[Measurement of Physical Properties]

Figure 4:
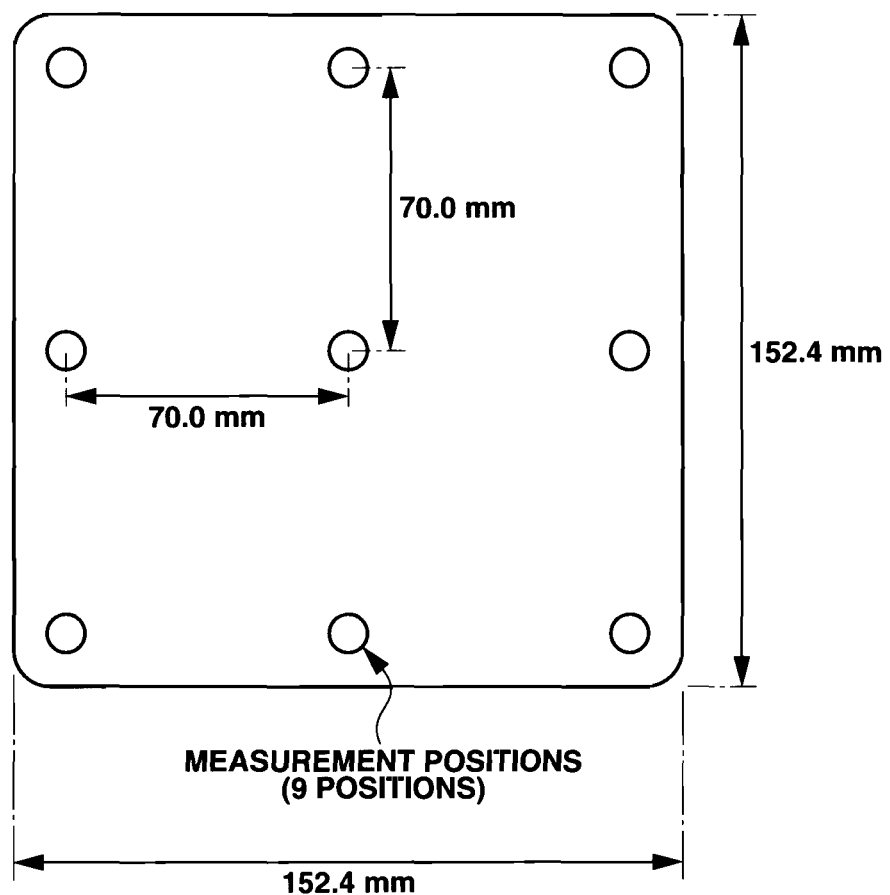
FIG. 4 is a plan view of a quartz glass sample, indicating positions at which physical properties are measured in Examples.

The polished substrate was measured for flatness in a central region of 132×132 mm squares, with the result shown in Table 2. It was measured for $TiO_2$ concentration by the EPMA method at nine positions as shown in FIG. 4. It was also measured for fictive temperature at the positions. Table 2 reports the maximum and minimum values of $TiO_2$ concentration and fictive temperature, and a distribution (maximum minus minimum) thereof.

A sample of 1 mm thick for stria curvature radius measurement (curvature sample 1) was cut out of the polished substrate along one diagonal line and perpendicular to the polished surface, and polished on opposite surfaces, after which the curvature radius of striae was measured by the oil on plate method. Table 2 reports the minimum curvature radius (Curvature radius 1). Similarly another sample (curvature sample 2) was cut out of the polished substrate along another diagonal orthogonal to the one and perpendicular to the polished surface. The curvature radius of striae was measured. Table 2 reports the minimum curvature radius (Curvature radius 2).

Example 2

Annealing Step

A quartz glass substrate was prepared by the same procedure as in Example 1 aside from omitting the annealing step.

Example 3

Annealing Step

A quartz glass substrate was prepared by the same procedure as in Example 1 except that the annealing step included holding in air at 850° C. for 150 hours and slow cooling at a rate of 2° C./hr down to 200° C.

Example 4

Homogenization by Zone Melting

A quartz glass substrate was prepared by the same procedure as in Example 1 except that the homogenization treatment by zone melting used three burners having a hydrogen gas injection orifice with an inner diameter of 60 mm.

Comparative Example 1

Homogenization by Zone Melting

After the second homogenization treatment by zone melting, the chucks were co-rotated synchronously at 50 rpm; and the burner assembly was moved back to the left end of the titania-doped quartz glass ingot. A molten zone was formed by intense heating. After confirmation of melting, with the left chuck secured, the right chuck was slowly moved toward the left chuck to reduce the distance therebetween for thereby shaping into a tablet having a straight barrel with a diameter of 130 mm. The tablet shaped titania-doped quartz glass body was cut off at opposite ends from the support bars.

[Member Preparation Step 1]

The opposite ends of the straight barrel of the tablet shaped titania-doped quartz glass body were cut perpendicular to the homogenization treatment axis during the second homogenization treatment by zone melting, obtaining a cylindrical titania-doped quartz glass body having a diameter of 130 mm and a length of 700 mm. In a carbon crucible, the cylindrical body was rested with its one cut section at the bottom, and heated at 1,700° C. for 6 hours, whereby it was hot shaped into a columnar block of 155 mm×155 mm. The block was sliced into a substrate of 6.8 mm thick, which was lapped.

A sample of 1 mm thick for stria curvature radius measurement (curvature sample 1) was cut out of the polished substrate along one diagonal and perpendicular to the polished surface, and polished on opposite surfaces, after which the curvature radius of striae was measured by the oil on plate method. Table 2 reports the minimum curvature radius (Curvature radius 1). Similarly another sample (curvature sample 2) was cut out of the polished substrate along another diagonal orthogonal to the one and perpendicular to the polished surface. The curvature radius of striae was measured. Table 2 reports the minimum curvature radius (Curvature radius 2).

TABLE 2

| | | $TiO_2$ concentration (wt %) | | | Fictive temperature (° C.) | | | Curvature radius 1 (mm) | Curvature radius 2 (mm) | Flatness (nm) |
|---|---|---|---|---|---|---|---|---|---|---|
| | | Max | Min | Distribution | Max | Min | Distribution | | | |
| Example | 1 | 6.9 | 6.8 | 0.1 | 755 | 752 | 3 | >250 | >250 | 72 |
| | 2 | 6.8 | 6.7 | 0.1 | 925 | 887 | 38 | >250 | >250 | 82 |
| | 3 | 6.8 | 6.7 | 0.1 | 796 | 779 | 17 | >250 | >250 | 78 |
| | 4 | 6.9 | 6.7 | 0.2 | 753 | 750 | 3 | 168 | 172 | 97 |
| Comparative Example | 1 | 6.8 | 6.7 | 0.1 | 758 | 755 | 3 | 25 | 32 | 138 |
| | 2 | 6.5 | 5.8 | 0.7 | 987 | 969 | 18 | 128 | 135 | 109 |

Except the homogenization treatment by zone melting and member preparation step 1, the process was the same as Example 1.

Reference Example

Homogenization by Zone Melting

A single burner having a hydrogen gas injection orifice with an inner diameter of 60 mm was used. After the second homogenization treatment by zone melting, the chucks were co-rotated synchronously at 50 rpm; and the burner was moved back to the left end of the titania-doped quartz glass ingot. A molten zone was formed by intense heating. After confirmation of melting, with the left chuck secured, the right chuck was slowly moved toward the left chuck to reduce the distance therebetween. This step intended to form a tablet-shaped titania-doped quartz glass body, but failed to enlarge the diameter of a tablet straight barrel to 250 mm.

Comparative Example 2

After ultra-low expansion glass ULE® (Corning Inc.) was observed for striae, a columnar block of 155×155 mm was cut out in such a direction that striae were not exposed in the plane of 155×155 mm squares. The block was sliced into a substrate of 6.8 mm thick, which was lapped. The ULE® glass substrate as lapped was polished on end faces. On the main surfaces, rough polishing was performed with ceria abrasive, and precision polishing performed using a soft suede as polishing pad and a colloidal silica water dispersion having a $SiO_2$ concentration of 40 wt % as polishing slurry. The polishing step was followed by washing and drying, yielding a polished substrate of 152.4×152.4×6.35 mm.

[Measurement of Physical Properties]

The polished substrate was measured for flatness in a central region of 132×132 mm squares, with the result shown in Table 2. It was measured for $TiO_2$ concentration by the EPMA method at nine positions as shown in FIG. 4. It was also measured for fictive temperature at the positions. Table 2 reports the maximum and minimum values and a distribution thereof.

Japanese Patent Application No. 2013-008909 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An EUV lithography member made of titania-doped quartz glass containing striae having a curvature radius of at least 150 mm in a surface perpendicular to an EUV light-reflecting surface, wherein the EUV lithography member is directly formed from titania-doped quartz glass which has been homogenization treated by a zone melting method, without hot shaping and has a diameter of at least 220 mm after homogenization treatment.

2. The member of claim 1 wherein the titania-doped quartz glass has a fictive temperature of up to 850° C.

3. The member of claim 1 wherein the titania-doped quartz glass has a fictive temperature distribution of up to 20° C.

4. The member of claim 1 which is an EUV lithography photomask substrate.

5. A method for preparing an EUV lithography member, comprising the steps of homogenization treating titania-doped quartz glass by a zone melting method, and forming it into the member without hot shaping, wherein the titania-doped quartz glass after homogenization treatment has a diameter if at least 220 mm.

6. A titania-doped quartz glass for EUV lithography, containing striae having a curvature radius of at least 150 mm in a surface perpendicular to an EUV light-reflecting surface, wherein the EUV lithography member is directly formed from titania-doped quartz glass which has been homogenization treated by a zone melting method, without hot shaping, and has a diameter of at least 220 mm after homogenization treatment.

7. The titania-doped quartz glass of claim 6, having a fictive temperature of up to 850° C.

8. The titania-doped quartz glass of claim 6, having a fictive temperature distribution of up to 20° C.

* * * * *